United States Patent
Sakamoto et al.

(10) Patent No.: US 9,093,590 B2
(45) Date of Patent: Jul. 28, 2015

(54) SOLAR CELL AND SOLAR CELL MANUFACTURING METHOD

(75) Inventors: Tomonari Sakamoto, Shiga (JP); Naoya Kobamoto, Shiga (JP)

(73) Assignee: KYOCERA Corporation, Kyoto (JP)

( * ) Notice: Subject to any disclaimer, the term of this patent is extended or adjusted under 35 U.S.C. 154(b) by 1038 days.

(21) Appl. No.: 12/521,551

(22) PCT Filed: Dec. 26, 2007

(86) PCT No.: PCT/JP2007/074944
§ 371 (c)(1),
(2), (4) Date: Sep. 15, 2009

(87) PCT Pub. No.: WO2008/078771
PCT Pub. Date: Jul. 3, 2008

(65) Prior Publication Data
US 2010/0275987 A1    Nov. 4, 2010

(30) Foreign Application Priority Data

Dec. 26, 2006   (JP) .................................. 2006-349047
Oct. 30, 2007   (JP) .................................. 2007-281349

(51) Int. Cl.
*H01L 31/042*    (2014.01)
*H01L 31/068*    (2012.01)
(Continued)

(52) U.S. Cl.
CPC ........ *H01L 31/0682* (2013.01); *H01L 31/0224* (2013.01); *H01L 31/02245* (2013.01); *H01L 31/03529* (2013.01); *H01L 31/1804* (2013.01); *Y02E 10/547* (2013.01)

(58) Field of Classification Search
CPC ..................... H01L 31/02245; H01L 31/0224
USPC .......................................................... 136/256
See application file for complete search history.

(56) References Cited

U.S. PATENT DOCUMENTS 4,595,790 A * 6/1986 Basol ............................ 136/256
5,661,041 A * 8/1997 Kano ............................. 438/72
(Continued)

FOREIGN PATENT DOCUMENTS

EP     0881694 A1    12/1998
JP     56-154172     11/1981
(Continued)

OTHER PUBLICATIONS

Search report for corresponding European application 07860173-9.
(Continued)

*Primary Examiner* — Devina Pillay
(74) *Attorney, Agent, or Firm* — Procopio, Cory, Hargreaves & Savitch LLP

(57) ABSTRACT

A solar cell with a simple configuration and high efficiency, and a manufacturing method therefor are provided. A solar cell of the present invention includes a semiconductor substrate that has a first surface receiving sunlight and a second surface on the back side of the first surface and that includes a through hole passing through between the first surface and the second surface; and a first electrode that includes a main electrode portion containing a glass component and formed on the first surface of the semiconductor substrate and a conducting portion electrically connected to the main electrode portion, formed in the through hole of the semiconductor substrate, and having a lower glass-component content than the main electrode portion.

6 Claims, 10 Drawing Sheets

(51) Int. Cl.
*H01L 31/0224* (2006.01)
*H01L 31/0352* (2006.01)
*H01L 31/18* (2006.01)

(56) References Cited

U.S. PATENT DOCUMENTS

| | | | |
|---|---|---|---|
| 5,759,292 A * | 6/1998 | Arimoto et al. | 136/256 |
| 6,384,317 B1 | 5/2002 | Kerschaver et al. | 136/256 |
| 6,632,730 B1 | 10/2003 | Meier et al. | |
| 2004/0200522 A1 | 10/2004 | Fukawa et al. | |
| 2005/0172996 A1* | 8/2005 | Hacke et al. | 136/256 |
| 2007/0186971 A1* | 8/2007 | Lochun et al. | 136/256 |

FOREIGN PATENT DOCUMENTS

| | | |
|---|---|---|
| JP | 61-86956 | 6/1986 |
| JP | 63-211773 | 9/1988 |
| JP | 04-015962 | 1/1992 |
| JP | 2000-150929 | 5/2000 |
| JP | 2001-024328 | 1/2001 |
| JP | 2002-500825 | 1/2002 |
| JP | 2003529207 A | 9/2003 |
| JP | 2005-019576 | 1/2005 |
| JP | 2005-129660 | 5/2005 |
| WO | 0141221 A1 | 6/2001 |

OTHER PUBLICATIONS

Japanese language office action dated Mar. 6, 2012 and its English language partial translation issued in corresponding Japanese application 2008551133.

* cited by examiner

F I G . 3
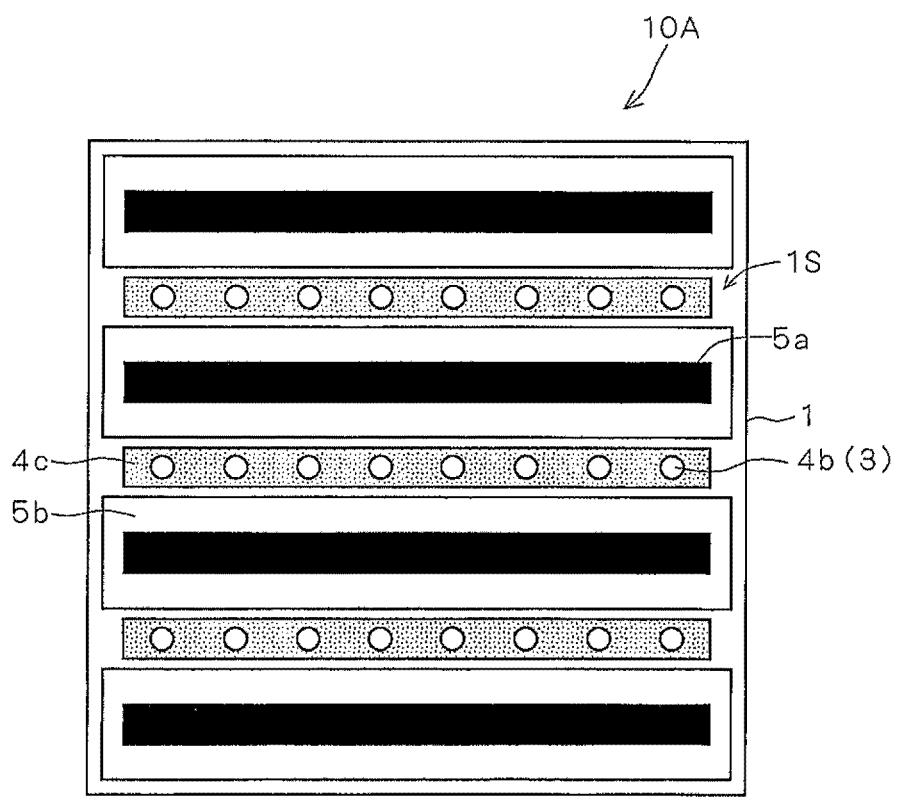

F I G . 5
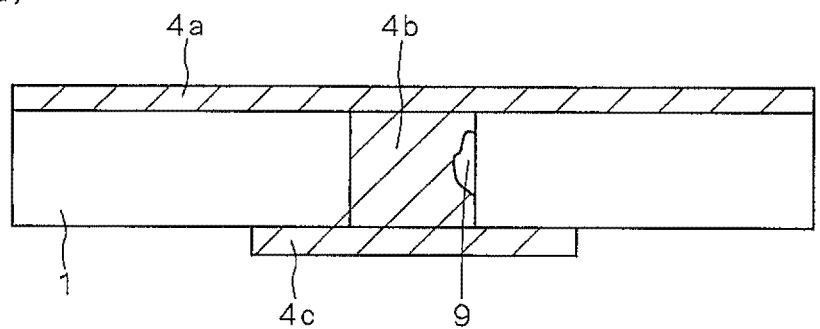
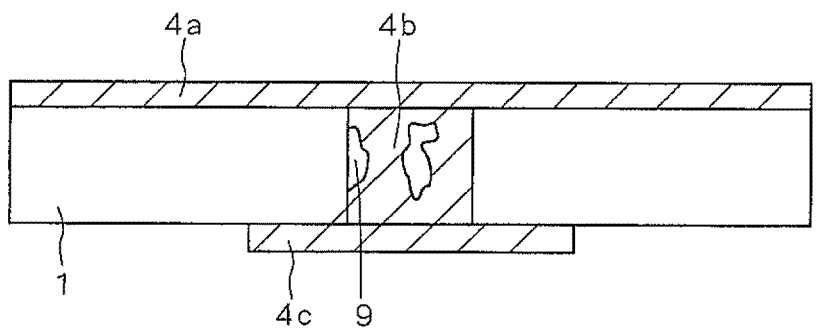

F I G . 1 1
(a)
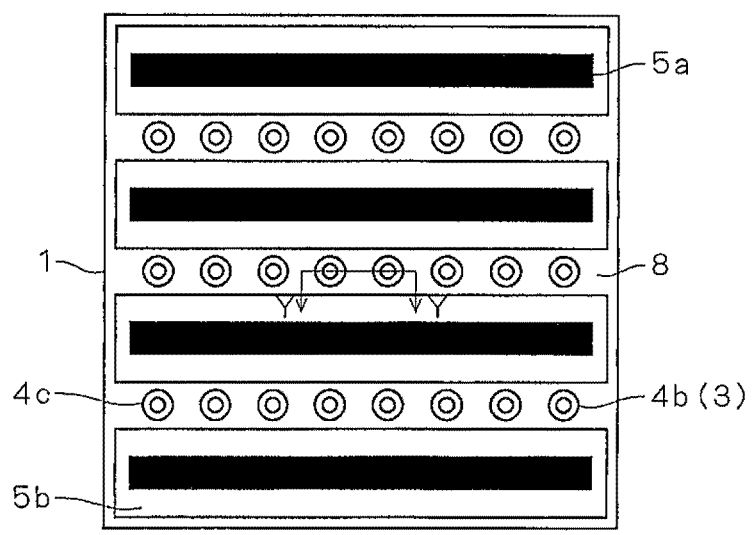
(b)
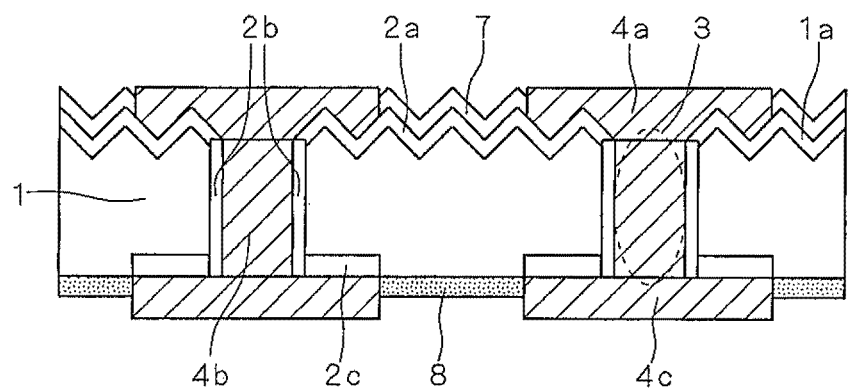

SOLAR CELL AND SOLAR CELL MANUFACTURING METHOD

TECHNICAL FIELD

The present invention relates to a solar cell and a solar cell manufacturing method.

BACKGROUND ART

A solar cell module includes a plurality of solar cells. In recent years, through-hole type solar cells have been considered as one of the measures to increase the efficiency of a solar cell module.

A through-hole type solar cell is provided with through holes that pass through from the light receiving surface side of the solar cell to the back surface side so as to eliminate electrodes on the light receiving surface side or reduce the number of electrodes on the light receiving surface side as compared to the case of a conventional solar cell, thereby increasing the light receiving surface area and achieving a higher efficiency. For instance, a configuration has been disclosed, in which the electrode on the light receiving surface side is disposed on the surface of the crystal substrate of a first conductivity type, then a compound semiconductor layer of the same first conductivity type and another compound semiconductor layer of a second conductivity type different from the first conductivity type are deposited thereon in order, and the electrode on the light receiving surface side and the electrode on the back surface side are brought into conduction via through holes that penetrate the crystal substrate and the compound semiconductor layers (see, for example, Japanese Patent Application Laid-open No. 63-211773 (Patent Document 1)).

Also, a solar cell in which the range of formation of the second conductivity type layer having an opposite conductivity type to that of the semiconductor substrate of one conductivity type is extended to the periphery of the back surface side of the through holes has been disclosed (see, for example, Japanese Patent Publication No. 2002-500825 (Patent Document 2)).

With either of the above-described conventional techniques, the materials for forming electrodes or through holes contain glass in order to improve the bond strength with the semiconductor substrate. However, the problem is that the presence of such glass can cause the output characteristics of a solar cell to deteriorate.

DISCLOSURE OF INVENTION

The present invention has been made in view of these problems and provides a solar cell with a simple configuration and high efficiency, and a manufacturing method therefor.

A solar cell according to a first aspect of the present invention includes a semiconductor substrate that includes a through hole; and a first electrode that includes a main electrode portion containing a glass component and formed on a surface of the semiconductor substrate and a conducting portion electrically connected to the main electrode portion, formed in the through hole of the semiconductor substrate, and having a lower glass-component content than the main electrode portion.

The present invention is capable of reducing corrosion on the semiconductor substrate by the glass component as well as lowering the electrical resistance of the conducting portion, thereby enabling an improvement in the output characteristics of a solar cell.

BRIEF DESCRIPTION OF DRAWINGS

FIG. 3 is a plan view of the solar cell 10A as viewed from a second surface 1S side.

FIG. 5 is a diagram illustrating details of a cross-sectional structure of a conducting portion 4b.

FIG. 9 is a schematic cross-sectional diagram of a solar cell 10D that includes, instead of a third opposite conductivity type layer 2c, an insulating material layer 8 of oxide film, nitride film, or the like.

FIG. 11 is a diagram illustrating another embodiment of a back electrode portion 4c.

BEST MODE FOR CARRYING OUT THE INVENTION

Hereinafter, preferred embodiments of the present invention will be described in detail with reference to the accompanying drawings.

First Preferred Embodiment

<<Solar Cell>>

Figure 1:
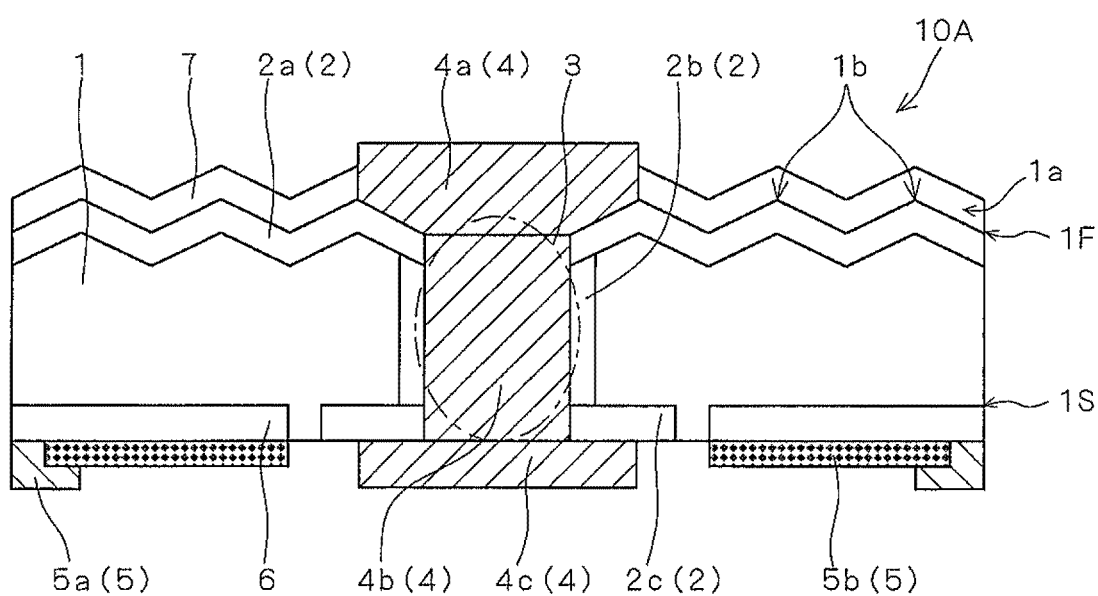
FIG. 1 is a schematic cross-sectional diagram showing a configuration of a solar cell 10A according to a first preferred embodiment.

FIG. 1 is a schematic cross-sectional diagram showing a configuration of a solar cell 10A according to a first preferred embodiment of the present invention.

The solar cell 10A includes a semiconductor substrate 1 having one conductivity type, an opposite conductivity type layer 2 having a different conductivity type from the semiconductor substrate 1, a first electrode 4, and a second electrode 5.

The solar cell 10A includes the semiconductor substrate 1 that has a first surface 1F (in FIG. 1, the top surface) and a second surface 1S (in FIG. 1, the bottom surface) on the back side of the first surface 1F. In the case of the solar cell 10A, the first surface 1F is the light receiving surface (for convenience of description, the first surface 1F may also be referred to as the light receiving surface of the semiconductor substrate 1, or the like).

The semiconductor substrate 1 may be a crystalline silicon substrate, such as a single crystalline silicon substrate or a polycrystalline silicon substrate, that contains a predetermined dopant (an impurity for controlling the conductivity type) and has one conductivity type (e.g., p type). In another embodiment, a plate-like silicon obtained by a pull method, such as a ribbon method, may be used. The semiconductor substrate 1 may preferably have a thickness of 300 μm or less, more preferably 250 μm or less, and still more preferably 150 μm or less.

The present preferred embodiment describes, as an example, the case where the semiconductor substrate 1 is a crystalline silicon substrate of a p conductivity type. In order for the semiconductor substrate 1 of a crystalline silicon substrate to have a p conductivity type, a preferable example of a dopant used is boron or gallium. In particular, the use of gallium reduces the light-induced degradation phenomenon, thereby enabling a solar cell to achieve a high efficiency.

On the first surface 1F side of the semiconductor substrate 1, a textured structure (uneven structure) 1a with a number of superfine projections 1b is formed in order to reduce the reflection of incident light on the first surface 1F and to thereby absorb more sunlight into the semiconductor substrate 1. The projections 1b may preferably have a width of 2 μm or less, a height of 2 μm or less, and an aspect ratio (height/width) of 0.1 to 2. The textured structure 1a is formed using a technique such as wet etching or dry etching. Note that the provision of the textured structure 1a is not an absolute necessity of the configuration of the present preferred embodiment, and such a structure may be formed as necessary.

The semiconductor substrate 1 also has a plurality of through holes 3 formed so as to pass through between the first surface 1F and the second surface 1S. However, for convenience of illustration, FIG. 1 shows a cross section that includes only one through hole 3. As described later, a second opposite conductivity type layer 2b is formed on the surfaces of the through holes 3. Also, a conducting portion 4b of the first electrode 4 is formed in each through hole 3. The through holes 3 may preferably be formed with a constant pitch, having a diameter in the range of 50 to 300 μm. Diameters of the through holes 3 may be varied between on the first surface 1F and on the second surface 1S. The through holes 3 are formed with a mechanical drill, a water jet, a laser processing device, or the like.

The opposite conductivity type layer 2 has an opposite conductivity type from that of the semiconductor substrate 1. The opposite conductivity type layer 2 includes a first opposite conductivity type layer 2a formed on the first surface 1F side of the semiconductor substrate 1, the second opposite conductivity type layer 2b formed on the surfaces of the through holes 3, and a third opposite conductivity type layer 2c formed on the second surface 1S side of the semiconductor substrate 1. In the case where the semiconductor substrate 1 is a silicon substrate of a p conductivity type, the opposite conductivity type layer 2 is formed having an n conductivity type. This is implemented by, for example, diffusing phosphorus by a thermal diffusion method or the like. The method of forming the opposite conductivity type layer 2 will be described in detail later.

The first opposite conductivity type layer 2a may preferably be formed as an n⁺ type layer having a sheet resistance of approximately 60 to 300Ω/□. This range of sheet resistance can suppress an increase in surface recombination on the first surface 1F and an increase in electrical surface resistance. In particular, in the case where the first opposite conductivity type layer 2a is provided in combination with the textured structure 1a, the short circuit current in the solar cell 10A will increase significantly. Note that the sheet resistance value may be measured by a four-point probe method. For example, when four metal probes arranged in a straight line are brought into contact on the surface of the semiconductor substrate 1 with one another with the application of pressure and current is passed through the outer two probes, the voltage generated between the inner two probes is measured and the resistance value is calculated according to Ohm's law using this voltage and the passed current.

The first opposite conductivity type layer 2a may preferably be formed to a depth of approximately 0.2 to 0.5 μm in a region of the first surface 1F of the semiconductor substrate 1 other than where the through holes 3 are present. The third opposite conductivity type layer 2c may be formed only around the peripheries of the through holes 3 on the second surface 1S of the semiconductor substrate 1.

With this opposite conductivity type layer 2, the solar cell 10A has a pn junction formed between the opposite conductivity type layer 2 and a bulk region (a region other than the opposite conductivity type layer 2) of the semiconductor substrate 1.

The solar cell 10A has a heavily doped layer 6 within the semiconductor substrate 1. The heavily doped layer 6 is provided for the purpose of forming an internal electric field inside the solar cell 10A (for the purpose of obtaining what is called a "back surface field (BSF) effect") in order to prevent a reduction in power generation efficiency due to the occurrence of carrier recombination in the vicinity of the second surface 1S of the semiconductor substrate 1. The heavily doped layer 6 is formed on an approximately whole second surface 1S of the semiconductor substrate 1 other than in the vicinity of the through holes 3. More specifically, the heavily doped layer 6 is formed so as not to be in contact with the third opposite conductivity type layer 2c on the second surface 1S side (i.e., so as to provide a bulk region of the semiconductor substrate 1 therebetween).

The phrase "heavily doped" as used herein indicates that a dopant is at a higher concentration than the concentration at which the semiconductor substrate 1 was doped so as to have one conductivity type. The heavily doped layer 6 may preferably be formed by, for example, diffusing a dopant such as boron or aluminum from the second surface 1S so that the dopant has a concentration of approximately $1 \times 10^{18}$ to $5 \times 10^{21}$ atoms/cm³. By doing so, the heavily doped layer 6 has a p⁺ conductivity type and achieves an ohmic contact with a current collecting portion 5b which will be described later.

In the case of using boron as a dopant, the heavily doped layer 6 may be formed by a thermal diffusion method using BBr₃ (boron tribromide) as a diffusion source. In the case of using aluminum as a dopant, the heavily doped layer 6 may be formed by applying and firing an aluminum paste of an aluminum powder, an organic vehicle, and the like.

The heavily doped layer 6 may preferably be formed on 70% to 90% of the whole second surface 1S area of the semiconductor substrate 1 as viewed in a plane. If the percentage is 70% or higher, a BSF effect that improves the output characteristics of the solar cell 10A is easy to obtain. If the percentage is 90% or lower, a region for forming a back electrode portion 4c of the first electrode 4 and a region RE where the current collecting portion 5b is not formed and that would be necessary for formation of the back electrode portion 4c are easy to secure. Note that since, as described later, the solar cell 10A according to the present invention may require a smaller region for forming the back electrode portion 4c than a conventional solar cell 10A, the heavily doped layer 6 can be formed over enough of a wide range, as wide as 90% of the whole second surface 1S area at the maximum as viewed in a plane.

The solar cell 10A includes an anti-reflective coating 7 on the first surface 1F side of the semiconductor substrate 1. The anti-reflective coating 7 has the function of reducing the reflection of incident light on the surface of the semiconductor substrate 1 and is formed on the first opposite conductivity type layer 2a. The anti-reflective coating 7 may preferably be formed of a silicon nitride film (SiN$_x$ film, which has a wide variety of composition ratios (x) centering about Si₃N₄ stoichiometry), an oxide material film (TiO$_2$ film, SiO$_2$ film, MgO film, ITO film, SnO$_2$ film, ZnO film), or the like. The thickness of the anti-reflective coating 7 may have a different preferable value depending on its components, but may be set to a value that satisfies the condition that no incident light be reflected. For example in the case where the semiconductor substrate 1 is a silicon substrate, the anti-reflective coating 7 may be formed to a thickness of approximately 500 to 1200 Å, using a material having a refractive index of approximately 1.8 to 2.3. Note that the provision of the anti-reflective coating 7 is not an absolute necessity of the configuration of the present preferred embodiment, and the anti-reflective coating 7 may be formed as necessary. The anti-reflective coating 7 is formed using a technique such as PECVD, vapor depotision, or sputtering.

The first electrode 4 consists of a main electrode portion 4a formed on the first surface 1F of the semiconductor substrate 1, a back electrode portion 4c formed on the second surface 1S, and a conducting portion 4b provided in the through holes 3 that provides electrical connection between the main electrode portion 4a and the first connection portion 4c. The main electrode portion 4a has the function of collecting carriers generated near the first surface 1F, and the first connection portion 4c serves as a wiring connection portion that connects to external wiring. The first electrode 4 has a first polarity.

The main electrode portion 4a, the conducting portion 4b, and the back electrode portion 4c are formed by, for example, applying a conductive paste containing a metal powder, such as silver, copper, gold, or platinum, onto either the first surface 1F of the semiconductor substrate 1 (in the case of forming the main electrode portion 4a and the conducting portion 4b) or the second surface 1S (in the case of forming the back electrode portion 4c) in a predetermined electrode pattern and then firing the applied paste. Note that use of a silver paste is preferable in terms of both productivity and characteristics.

On the other hand, the second electrode 5 has a second polarity different from the first polarity of the first electrode 4 and consists of a bus bar portion 5a and a current collecting portion 5b. The current collecting portion 5b is formed on the heavily doped layer 6 formed on the second surface 1S side of the semiconductor substrate 1 and collects carriers generated on the second surface 1S side. Note that the current collecting portion 5b also has the function of reflecting the light that was not absorbed in the semiconductor substrate 1 again into the semiconductor substrate 1, thereby increasing the photoelectric current. The bus bar portion 5a serves as a wiring connection portion that connects to external wiring. At least part of the bus bar portion 5a of the solar cell 10A is formed overlapping the current collecting portion 5b.

The current collecting portion 5b is formed by, for example, applying a conductive paste containing a metal powder, such as aluminum or silver, onto the heavily doped layer 6 in a predetermined electrode pattern and then firing the applied paste. Note that, if the conductive paste is an aluminum paste, the heavily doped layer 6 and the current collecting portion 5b may be formed simultaneously, as described later.

The bus bar portion 5a is formed by applying a conductive paste containing a metal powder, which is predominantly composed of silver, onto the heavily doped layer 6 in a predetermined electrode pattern and then firing the applied paste. Thus, the bus bar portion 5a is electrically connected to the current collecting portion 5b.

In the case where silver is used for this bus bar portion 5a and aluminum for the current collecting portion 5b, the bus bar portion 5a may preferably contain zinc or a zinc alloy. Such a structure reduces an increase in the resistance between the current collecting portion 5b and the bus bar portion 5a. In particular, if the bus bar portion 5a is formed containing 7 to 35 parts by weight of zinc or a zinc alloy per 100 parts by weight of silver, the output characteristics of the solar cell 10A are less likely to deteriorate.

Figure 2:
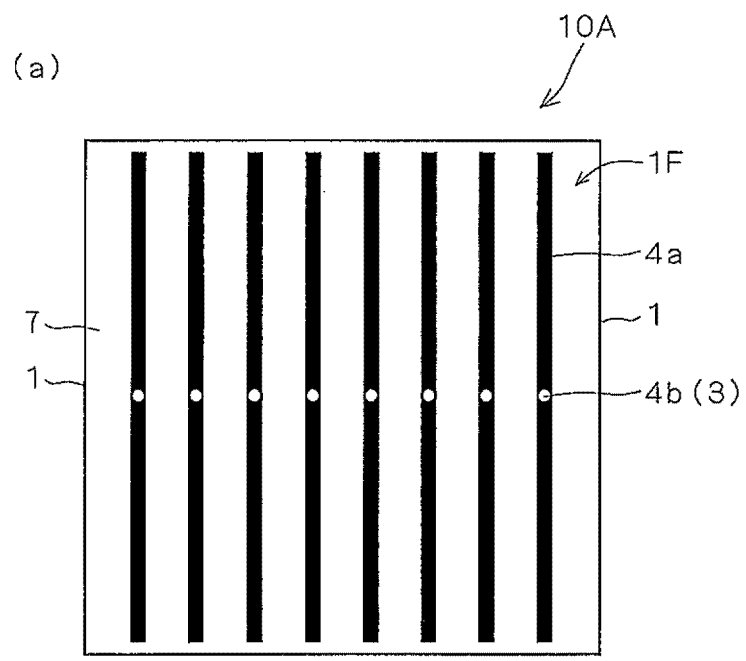
FIG. 2 is a plan view of the solar cell 10A as viewed from a first surface side.
Figure 2:
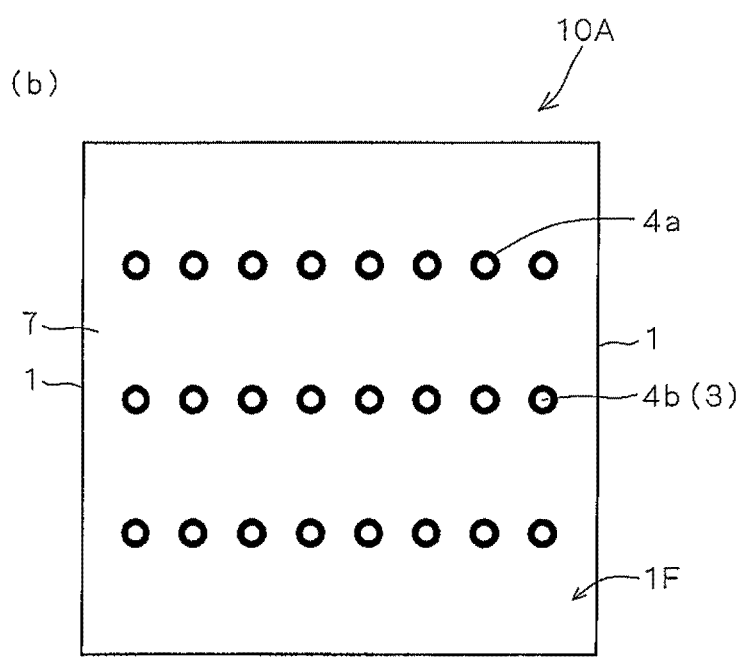

FIGS. 2(a) and 2(b) are plan views of the solar cell 10A as viewed from the first surface 1F side. In FIG. 2(a), the through holes 3 are provided in a straight line parallel to one side of the semiconductor substrate 1 and spaced at approximately regular intervals. Furthermore, a plurality of conducting portions 4b are formed corresponding to the through holes 3. In FIG. 2, the positions where the conducting portions 4b are formed, shown by open circles, correspond also to the positions where the through holes 3 are formed. In a preferable embodiment, the main electrode portions 4a may be formed in a plurality of lines as shown in FIG. 2(a). In such a case, each line is connected to at least one conducting portion 4b selected from among at least one conducting portion 4b. Such provision of the main electrode portions 4a enables carriers generated in the semiconductor substrate 1 to be collected efficiently and to be taken out from the back electrode portions 4c on the second surface side through the conducting portions 4b.

FIG. 2(b) illustrates the case where the through holes 3 are formed into a plurality of rows (in FIG. 2, three rows) parallel to one side of the semiconductor substrate 1, and a conducting portion 4b is formed in each through hole. FIG. 2(b) also illustrates the case where the main electrode portion 4a is formed into points connected to at least the conducting portions 4b. Such point-shaped main electrode portions increase the amount of light received on the semiconductor substrate 1.

In the case the main electrode portions 4a are provided on the first surface 1F side of the semiconductor substrate 1 as shown in FIGS. 2(a) and 2(b), concentration of current flow on a single conducting portion 4b and an increase in resistance loss are reduced, then, the output characteristics of the solar cell are not likely to detriate.

Besides, in the solar cell 10A, a high light-receiving efficiency can be achieved because the occupied ratio of the main electrode portion 4a and the conducting portion 4b, which form the first electrode 4, to the whole first surface 1F, which is the light receiving surface, is considerably small, as well as being able to collect carriers generated near the first surface 1F with efficiency because the main electrode portion 4a is formed uniformly.

FIG. 3 is a plan view of the solar cell 10A as viewed from the second surface 1S side, showing an exemplary pattern of the back electrode portion 4c and the bus bar portion 5a. In the case shown in FIG. 3, a back electrode portion 4c has a long shape (strip shape) having a length along the direction of the arrangement of conducting portions 4b and is formed in a position immediately under a plurality of conducting portions 4b (or through holes 3). A back electrode portion 4c is connected to conducting portions 4b immediately above. A plurality of back electrode portions 4c are formed corresponding to the arrangement of conducting portions 4b. In FIG. 3, three back electrode portions 4c are formed.

Also, the current collecting portion 5b is formed on an approximately whole second surface 1S except on the back electrode portions 4c and their peripheries. By providing the current collecting portion 5b on an approximately whole surface other than the region where the back electrode portions 4c are formed, the length of the migration of carriers collected by the current collecting portion 5b can be reduced and accordingly the amount of carriers taken out from the bus bar portion 5a can be increased. This contributes to an improvement in the output characteristics of the solar cell 10A. The current collecting portion 5b may preferably be formed in the range of 70% to 90% of the whole second surface 1S area of the semiconductor substrate 1.

Moreover, on the current collecting portion 5b, a plurality of bus bar portions 5a, each having a similar long shape to the back electrode portions 4c (strip shape), are formed parallel to a plurality of back electrode portions 4c. In the case of FIG. 3, four bus bar portions 5a are formed.

With the above-described configuration, the solar cell 10A having an $n^+/p/p^+$ junction consisting of the opposite conductivity type layer 2, the semiconductor substrate 1, and the heavily doped layer 6 provided between the first electrode 4 and the second electrode 5; is achieved. In other words, the first electrode 4 and the second electrode 5 have different polarities, then, an electromotive force generated between both electrodes according to the energy of light incident on the first surface 1F, which is the light receiving surface, is taken out from the solar cell 10A. In particular, since the conducting portion 4b in the solar cell 10A provides continuity between the main electrode 4a provided on the first surface side and the back electrode portion 4c provided on the second surface side, current collected on the first surface side can be efficiently removed from the second surface side.

<<Detailed Structure of First Electrode>>

Next, the first electrode 4 of the solar cell 10A with the above-described configuration is described in more detail.

First, the main electrode portion 4a of the first electrode 4 is formed containing a predetermined percentage of a glass component from the viewpoint of securing the bond strength to the semiconductor substrate 1 (more strictly, with the first opposite conductivity type layer 2a) and to thereby reliably make contact therewith. If the main electrode portion 4a and the semiconductor substrate 1 are in sufficient contact with each other, photogenerated carriers (electron carriers or hole carriers) generated by photoelectric conversion of the light incident on and absorbed in the solar cell 10A can be collected efficiently.

On the other hand, the conducting portion 4b of the first electrode 4 is formed having a lower glass-component content than the main electrode portion 4a. Note that, in the present preferred embodiment, a low glass-component content indicates that the amount of a glass component is small relative to the amount of metal, which is a major constituent. Preferably, the conducting portion 4b may have a glass-component content of one fifth or less of the glass-component content of the main electrode portion 4a.

Such a glass component is obtained by, for example, firing a glass frit containing $PbO$—$SiO_2$—$B_2O_3$ glass, $Bi_2O_3$—$PbO$—$SiO_2$—$B_2O_3$ glass, non-lead $ZnO$—$SiO_2$—$B_2O_3$ glass, or the like.

FIG. 5 shows an exemplary cross-sectional structure of the conducting portion 4b. If the conducting portion 4b has a low glass-component content as described above, the bond strength between the conducting portion 4b and the semiconductor substrate 1 (more specifically, between the conducting portion 4b and the second opposite conductivity type layer in the case of FIG. 5) is reduced, which may create a clearance 9 in part between the surface of a through hole 3 and the conducting portion 4b or inside the conducting portion 4b as shown in FIGS. 5(a) and 5(b).

However, if the main electrode portion 4a and the semiconductor substrate 1 (the first opposite conductivity type layer 2a) are in contact with each other and the conducting portion 4b ensures sufficient continuity between the main electrode portion 4a and the back electrode portion 4c, reverse saturation current occurring in dark in a pn junction region (depletion layer region) of the solar cell 10A can be reduced, and an improvement in the fill factor (FF) can be obtained.

It has also been confirmed that, if the rate at which a through hole 3 is filled with the conducting portion 4b is 50% or higher and, more preferably, 70% or higher, sufficient continuity can be ensured between the main electrode portion 4a and the back electrode portion 4c.

It is more preferable for the solar cell 10A, in terms of an improvement in characteristics, to reduce the reverse saturation current occurring in dark in a depletion layer region in the vicinity of the second opposite conductivity type layer 2b than to increase the degree of contact between the conducting portion 4b and the second opposite conductivity type layer 2b in order to increase carrier collect efficiency. One of the reasons for this is considered to be that the second opposite conductivity type layer 2b that may be covered and hidden by the main electrode portion 4a and the conducting portion 4b formed around a through hole 3 has a smaller amount of received light and, thus, originally a smaller contribution to power generation than the first opposite conductivity type layer 2a.

In view of these findings, the first electrode 4 of the solar cell 10A of the present preferred embodiment is so formed that, as described above, the conducting portion 4b has a lower glass abundance ratio than the main electrode portion 4a.

Conductive pastes having different weight ratios of a glass frit relative to a metal powder, which is a major constituent, are used for forming the main electrode portion 4a and the conducting portion 4b. Preferably, the relationship between the conductive pastes used for the formation of the main electrode portion 4a and the conducting portion 4b is that a conductive paste for forming the conducting portion 4b (hereinafter referred to as a second conductive paste) has a glass-frit content of one fifth or less of the glass-fit content of a conductive paste for forming the main electrode portion 4a (hereinafter referred to as a first conductive paste).

For example, in the case of using conductive pastes containing a metal powder that is predominantly composed of silver, the first conductive paste may preferably be obtained by adding 10 to 30 parts by weight of an organic vehicle as well as 1 to 10 parts by weight of a glass frit per 100 parts by weight of silver, and the second conductive paste may preferably be obtained by adding 10 to 30 parts by weight of an organic vehicle as well as 0.1 parts by weight or less, more preferably 0.05 parts by weight or less of a glass frit to per 100 parts by weight of silver. Since the weight ratio of silver and glass in each conductive paste can be considered approximately constant before and after firing the paste (i.e., the paste state and the post-firing state), such different compositions of the first and second conductive pastes allow the main electrode portion 4a and the conducting portion 4b to have different glass component abundance ratios.

In an alternative embodiment, conductive pastes may contain no glass frit. In such a case, the output characteristics of a solar cell can be further improved.

Moreover, the metal powder content of the first and second conductive pastes may be in the range of 70 to 90% by weight, with respect to the total weight. In particular, the metal powder content of the second conductive paste may preferably be 80% or higher by weight and, more preferably, 85% or higher by weight. Besides, the second conductive paste may preferably have a higher metal powder content than the first conductive paste. If the second conductive paste has a higher metal powder content than the first conductive paste, shrinkage of the conducting portion 4b at the time of firing can be suppressed and problems, such as disconnection, can be minimized. Furthermore, if a metal powder having a smaller average grain size than the metal powder used in the first conductive paste is used for the second conductive paste, the resistivity of the conducting portion 4b can be further reduced.

Furthermore, a metal powder in a variety of shapes, such as spherical, flake, or indefinite forms, may be used in the second conductive paste. In particular, if a second conductive paste containing a spherical metal powder is used for the formation of the conducting portions 4b, shrinkage of the conducting portion 4b at the time of firing can be reduced.

Still more, if a metal powder used in the second conductive paste is a silver powder, it is preferable to use a powder with high crystallinity. This can suppress shrinkage of the conducting portions 4b at the time of firing. The crystallinity may be evaluated by the diameter of crystallites. The larger the crystallite diameter, the higher is the crystallinity. The crystallite diameter is a value that is calculated from the half-value width of the peak (the peak in the vicinity of the diffraction angle 2θ of approximately 38.1°) of the (111) plane of silver in the X-ray diffraction measurement of a silver powder, using the following formula (Scherer's formula):

$$D = K \cdot \lambda / \beta \cos \theta$$

where D is the crystallite diameter, λ is the X-ray wavelength for measurement, β is the half-value width (radian), θ is the diffraction angle, and K is the Scherer constant (0.9)

In the present preferred embodiment, the value of the crystallite diameter D may be calculated under the condition of λ=1.54056 Å for the use of a Cu target. If the calculated value of the crystallite diameter of a silver powder is 50 nm or higher, the crystallinity thereof can be considered to be high.

An organic vehicle may be obtained by dissolving at least one kind of resin selected from a cellulose resin, an acrylic resin, a butyral resin, and the like in an organic solvent such as butyl carbitol, butyl carbitol acetate, or the like.

A glass fit may be PbO—SiO$_2$—B$_2$O$_3$ glass, Bi$_2$O$_3$—PbO—SiO$_2$—B$_2$O$_3$ glass, non-lead ZnO—SiO$_2$—B$_2$O$_3$ glass, or the like.

Note that the presence or absence of glass contained in the main electrode portion 4a and in the conducting portion 4b may be determined by performing observations with SEM or TEM photographs and component analysis by EPMA and then determining whether any layer considered to be a glass layer is present at an interface between the semiconductor substrate 1 and either the main electrode portion 4a or the conducting portion 4b. More specifically, in component analysis, if a glass frit component contained in a paste has been detected in an area corresponding to a glass layer, the glass component can be considered as being contained in the main electrode portion 4a or the conducting portion 4b and can be distinguished from an oxide film formed on the surface of the semiconductor substrate 1. Also, if the first conductive paste has a high glass-frit content, a glass component can be detected not only in the vicinity of the interface between the semiconductor substrate 1 and the main electrode portion 4a but also from within the main electrode portion 4a.

The present preferred embodiment achieves a solar cell with more excellent characteristics than a conventional solar cell by the conducting portion 4b, which ensures continuity between the main electrode portion 4a provided on the first surface 1F side of the semiconductor substrate 1 and the back electrode portion 4c provided on the second surface 1S side, having a smaller glass component abundance ratio than the main electrode portion 4a.

<<Solar Cell Manufacturing Method>>

Figure 4:
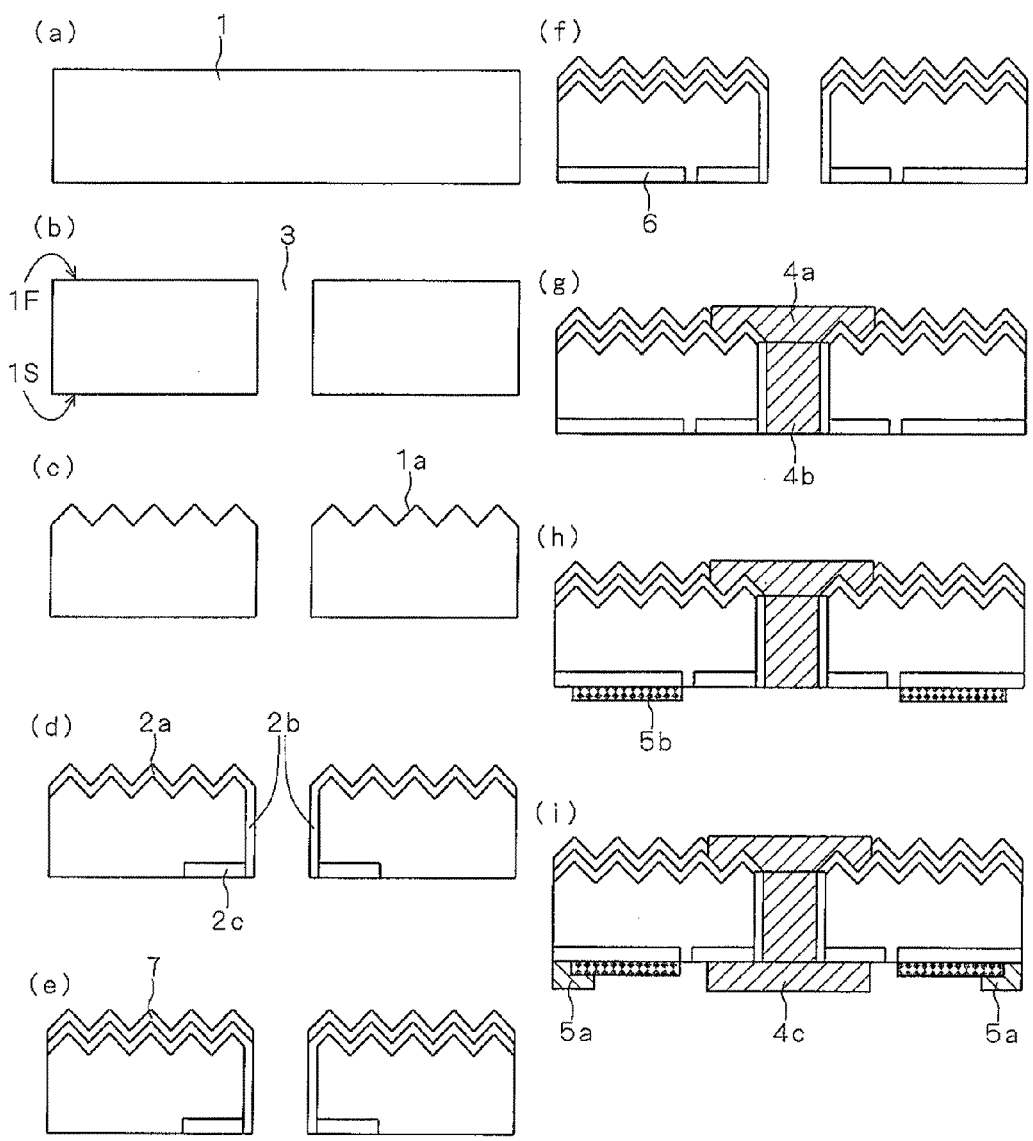
FIG. 4 is a diagram schematically showing an example of the manufacturing process for the solar cell 10A.

An example of the method for manufacturing the solar cell 10A according to the present preferred embodiment will be described. FIG. 4 is a diagram schematically showing the manufacturing process for a solar cell 10A, using such a manufacturing method.

<Semiconductor-Substrate Preparation Step>

First, a semiconductor substrate 1 of a p conductivity type is prepared (FIG. 4(a)).

In the case where the semiconductor substrate 1 is a single crystalline silicon substrate, the semiconductor substrate 1 may be obtained by cutting a single crystalline silicon ingot, which has been manufactured by a known method such as a FZ or CZ method, to a predetermined thickness. In the case where the semiconductor substrate 1 is a polycrystalline silicon substrate, the semiconductor substrate 1 may be obtained by cutting a polycrystalline silicon ingot, which has been manufactured by a method such as a cast method or in-mold solidification processing, to a predetermined thickness. Also, in the case of using plate-like silicon obtained by a pull method such as a ribbon method, a desired semiconductor substrate 1 may be obtained by cutting the plate-like silicon to a predetermined size and, as necessary, subjecting the cut silicon to a surface polishing process or the like.

Hereinafter, the case where the semiconductor substrate 1 is a crystalline silicon substrate that has been doped with a dopant, such as boron or gallium, at approximately $1 \times 10^{15}$ to $1 \times 10^{17}$ atoms/cm$^3$ and has a p conductivity type will be described by way of example. Such doping with a dopant may be implemented by, in each of the above-described silicon-ingot manufacturing methods, dissolving, in a silicon melt, an appropriate amount of either a dopant itself or a dopant material that contains an appropriate amount of a dopant in silicon.

Note that, in order to remove a mechanically damaged or contaminated layer of a substrate surface portion generated by slicing of the substrate, the surface portions on both the light receiving surface side and the back surface side of this substrate may respectively be etched to approximately 10 to 20 μm in NaOH or KOH, a mixed solution of a hydrofluoric acid and a nitric acid, or the like and then may be cleaned with deionized water or the like, so as to remove an organic component or a metal component.

<Through-Hole Forming Step>

Next, the through holes 3 are formed between the first surface 1F and the second surface 1S of the semiconductor substrate 1 (FIG. 4(b)).

The through holes 3 are formed with a mechanical drill, a water jet, a laser processing device, or the like. In such a case, machining will be performed from the second surface 1S side of the semiconductor substrate 1 toward the first surface 1F side in order to prevent the first surface 1F, which is the light receiving surface, from being damaged. Note that, if machining causes only minimal damage to the semiconductor substrate 1, it may be performed from the first surface 1F side toward the second surface 1S side. Further, etching may preferably be performed if the through holes 3 have any damaged layers. For example, mirror etching may be performed in a solution obtained by mixing a 2:7 ratio of a hydrofluoric acid and a nitric acid.

<Step of Forming Textured Structure on First Surface>

Next, a textured structure 1a with superfine projections (projecting portions) 1b is formed on the light receiving surface side of the semiconductor substrate 1 having the through holes 3, for the purpose of effectively reducing light reflectance (FIG. 4(c)).

Examples of the method of forming the textured structure 1a include a wet etching method using an alkaline aqueous solution such as NaOH or KOH and a dry etching method using an etching gas having the property of etching Si.

Here, in the case of using a wet etching method, the second surface 1S side of the semiconductor substrate 1 may preferably be masked with an anti-etching material in order to prevent the formation of asperities on the second surface 1S side.

In the case of using a dry etching method, a superfine textured structure 1a may be basically formed on only a processing surface side (the first surface 1F side). If an RIE method (reactive ion etching method) is used as a dry etching method, a superfine textured structure 1a that enables the light reflectance to be kept extremely low over a wide wavelength range may be formed over a wide area range in a short time, which contributes the generation efficiency of the solar cell 10A. In particular, the RIE method enables formation of an uneven structure without being influenced much by the crystal plane direction; therefore, even if the semiconductor substrate 1 is a polycrystalline silicon substrate, a superfine textured structure 1a having low light reflectance over the whole substrate area can be formed uniformly, irrespective of the plane direction of each crystal grain in the polycrystalline silicon substrate.

<Opposite-Conductivity-Type-Layer Forming Step>

Next, the opposite conductivity type layer 2 is formed. Specifically, the first opposite conductivity type layer 2a is formed on the first surface 1F of the semiconductor substrate 1, the second opposite conductivity type layer 2b is formed on the surfaces of the through holes 3, and the third opposite conductivity type layer 2c is formed on the second surface 1S (FIG. 4(d)).

In the case where the semiconductor substrate 1 is a crystalline silicon substrate of a p conductivity type, phosphorus (P) may preferably be used as an n-type dopant to form the opposite conductivity type layer 2.

The opposite conductivity type layer 2 is formed by a method such as a coating and thermal-diffusion method in which $P_2O_5$ in paste form is applied to a location where the opposite conductivity type layer 2 is to be formed on the semiconductor substrate 1 and then thermally diffused, a vapor-phase thermal diffusion method in which $POCl_3$ (phosphorus oxychloride) in gas form is used as a diffusion source and diffused onto a location where the opposite conductivity type layer 2 is to be formed, and an ion implantation method in which $p^+$ ions are diffused directly onto a location where the opposite conductivity type layer 2 is to be formed. Use of a vapor-phase thermal diffusion method is preferable because the opposite conductivity type layer 2 can be formed simultaneously on the surfaces of the through holes 3 and at locations on both the main surfaces of the semiconductor substrate 1 where the opposite conductivity type layer 2 is to be formed. Note that since the second opposite conductivity type layer 2b is formed in the through holes 3, it tends to have a lower dopant concentration and a smaller thickness than the first opposite conductivity type layer 2a.

Note that, under the condition that a diffusion region is also formed in a location other than where the opposite conductivity type layer 2 is to be formed, diffusion can be reduced in part by previously forming a diffusion prevention layer on that location before forming the opposite conductivity type layer 2. Alternatively, instead of forming a diffusion prevention layer, a diffusion region formed on a location other than where the opposite conductivity type layer 2 is to be formed may be removed by etching afterward. Note that if, as described later, the heavily doped layer 6 is formed using an aluminum paste after the formation of the opposite conductivity type layer 2, the presence of an already-formed shallow diffusion region can be ignored because a p type dopant or aluminum can be diffused to a sufficient depth at a sufficient concentration. In other words, the opposite conductivity type layer 2 does not particularly need to be removed from a location where the heavily doped layer 6 is to be formed. In such a case, a p-n isolation may be provided by applying and firing an etching paste of glass or the like only around the region where the back electrode portion 4c is to be formed.

<Anti-reflective Coating Forming Step>

Next, an anti-reflective coating 7 is formed on the first opposite conductivity type layer 2a (FIG. 4(e)).

The method of forming the anti-reflective coating 7 may, for example, be a PECVD method, a vapor depotision method, sputtering, or the like. For example, if the anti-reflective coating 7 is formed from a $SiN_x$ film by the PECVD method, the anti-reflective coating 7 is formed by diluting a mixed gas of silane ($Si_3H_4$) and ammonia ($NH_3$) with nitrogen ($N_2$) in a reaction chamber that is set at approximately 500° C. and then depositing the diluted gas by glow discharge plasma decomposition.

Note that the anti-reflective coating 7 may be formed in a predetermined pattern so as not to be formed in a location where the main electrode portion 4a is to be formed later on. Examples of a patterning method include a method in which the anti-reflective coating 7 in a location where the main electrode portion 4a is to be formed is removed by an etching method (wet etching or dry etching) using a mask such as a resist, and a method in which a mask is previously formed prior to the formation of the anti-reflective coating 7 and removed after the formation of the anti-reflective coating 7.

Alternatively, instead of using any patterning method, electrical contact may be established between the main electrode portion 4a and the first opposite conductivity type layer 2a by, after forming the anti-reflective coating 7 uniformly on the surface other than where the through holes 3 are formed, applying a conductive paste for forming the main electrode portion 4a directly onto a location on that surface where the main electrode portion 4a is to be formed and then by firing that paste (fire-through method).

<Step of Forming Heavily Doped Layer on Second Surface>

Next, a heavily doped layer 6 is formed in the second surface 1S of the semiconductor substrate 1 (FIG. 4(f)).

In the case of using boron as a dopant, the heavily doped layer 6 may be formed at a temperature of approximately 800 to 1100° C. by a thermal diffusion method using $BBr_3$ (boron tribromide) as a source of diffusion. In this case, prior to the formation of the heavily doped layer 6, a diffusion barrier of oxide film or the like may preferably be formed on a region other than where the heavily doped layer 6 is to be formed, e.g., on the already-formed opposite conductivity type layer 2, and then the diffusion barrier may be removed after the formation of the heavily doped layer 6.

In the case of using aluminum as a dopant, the heavily doped layer 6 may be formed by applying an aluminum paste that includes an aluminum powder, an organic vehicle, and the like, to the second surface 1S of the semiconductor substrate 1 by a print process and then subjecting the applied paste to heat treatment (firing) at a temperature of approximately 700 to 850° C. so that aluminum is diffused toward the semiconductor substrate 1. In this case, the heavily doped layer 6, which is a desired diffusion region, may be formed only in the second surface 1S that is the surface printed with the aluminum paste. In addition, a layer of aluminum formed on the second surface 1S by firing may not be removed and may be used as the current collecting portion 5b.

<First and Second Electrode Forming Step>

Next, the main electrode portion 4a and the conducting portion 4b, which constitute the first electrode 4, are formed (FIG. 4(g)).

Specifically, a second conductive paste for forming the conducting portion 4b is applied so as to fill in the through holes 3. Meanwhile, a first conductive paste for forming the main electrode portion 4a is applied in a formation pattern as shown in, for example, FIG. 2(a) or 2(b) on the first surface 1F side. Then, firing is performed at a maximum temperature of 500 to 850° C. for approximately several tens of seconds to several tens of minutes, so that the applied conductive pastes respectively form the main electrode portion 4a and the conducting portion 4b.

Various techniques, such as a screen printing method, a roll coating method, or a dispenser method, may be used as a method of application.

Note that, after the application of the conductive pastes and prior to firing, a solvent in a coating film may preferably be evaporated at a predetermined temperature so as to dry the coating film. It is also preferable in terms of productivity that the main electrode portion 4a and the conducting portion 4b be formed simultaneously by firing once.

Moreover, at the time of forming the main electrode portion 4a, the first conductive paste may be applied a plurality of times so that the main electrode portion 4a may have a greater thickness.

Still more, at the time of forming the conducting portion 4b, for example if any clearance 9 is present in part between the through hole 3 and the conducting portion 4b or inside the conducting portion 4b, the second conductive paste may be applied repeatedly so as to increase the rate at which the through holes 3 are filled with the second conductive paste.

Note that, as described above, in the case where the anti-reflective coating 7 is formed prior to the formation of the main electrode portion 4a and the conducting portion 4b, the main electrode portion 4a will be either formed on a patterned region or formed by the fire-through method.

In the case where the main electrode portion 4a is formed by the fire-through method, the main electrode portion 4a may be fired through the anti-reflective coating 7 by, for example, applying a conductive paste for use in a fire-through process that contains either a lead glass frit or phosphorus onto the anti-reflective coating and then firing the applied paste at a high temperature of 800° C. or higher. Note that, in that case, the second conductive paste as well may preferably be applied in the through holes 3 (fill in) and fired simultaneously.

Alternatively, the anti-reflective coating 7 may be formed after the main electrode portion 4a and the conducting portion 4b have been formed. In this case, neither the patterning of the anti-reflective coating 7 nor the use of the fire-through method is needed; therefore, the conditions for forming the main electrode portion 4a and the conducting portion 4b become easier. For example, the main electrode portion 4a and the conducting portion 4b may be formed without performing firing at a temperature as high as approximately 800° C.

Next, the collecting electrode 5b of the second electrode 5 is formed on the second surface of the semiconductor substrate 1 (FIG. 4(h)).

The current collecting portion 5b may also be formed by a method of application. More specifically, the current collecting portion 5b may be formed by forming a coating film with the application of a conductive paste, which is obtained by for example adding 10 to 30 parts by weight of an organic vehicle and 0.1 to 5 parts by weight of a glass frit to per 100 parts by weight of a metal powder such as aluminum or silver, to the second surface 1S of the semiconductor substrate 1 in a formation pattern of the current collecting portion 5b as shown in, for example, FIG. 3 and then by firing the coating film at a maximum temperature of 500 to 850° C. for approximately several tens of seconds to several tens of minutes. Note that, as described previously, in the case of using an aluminum paste, the heavily doped layer 6 and the current collecting portion 5b can be formed simultaneously.

Furthermore, the back electrode portion 4c and the bus bar portion 5a are formed on the second surface 1S of the semiconductor substrate 1 (FIG. 4(i)).

The back electrode portion 4c and the bus bar portion 5a may be formed simultaneously by a method of application. Specifically, the back electrode portion 4c and the bus bar portion 5a may be formed by forming a coating film with the application of a conductive paste, which is obtained by for example adding 10 to 30 parts by weight of an organic vehicle and 0.1 to 5 parts by weight of a glass frit to per 100 parts by weight of a metal powder of silver or the like, to the second surface 1S of the semiconductor substrate 1 in the formation pattern of the back electrode portion 4c and the bus bar portion 5a shown in FIG. 2(a) and then by firing the coating film at a maximum temperature of 500 to 850° C. for approximately several tens of seconds to several tens of minutes. In the case where the back electrode portion 4c and the bus bar portion 5a are formed with a silver paste containing a glass fit, the bond strength between the semiconductor substrate 1 and both the back electrode portion 4c and the bus bar portion 5a can be increased, which thereby reduces problems, such as the back electrode portion 4c or the bus bar portion 5a peeling off, that may occur when connecting a wiring material at the time of configuring a solar cell module described later.

Note that the back electrode portion 4c and the bus bar portion 5a may be formed at different times or may be formed with conductive pastes having different compositions. For example, in an alternative embodiment, a conductive paste for forming the bus bar portion 5a may contain silver and either zinc or a zinc alloy as a metal powder. For example if the bus bar portion 5a is formed with a conductive paste that contains 7 to 35 parts by weight of zinc or a zinc alloy with respect to 100 parts by weight of silver, 10 to 30 parts by weight of an organic vehicle, and 0.1 to 5 parts by weight of a glass frit, an increase in the series resistance between the bus bar portion 5a and the current collecting portion 5b can be reduced.

As another alternative, the bus bar portion 5a may be formed with a first conductive paste. In addition to this, the back electrode portion 4c as well may also be formed with a first conductive paste. In this case, productivity is increased because both the bus bar portion 5a and the back electrode portion 4c can be formed simultaneously.

The solar cell 10A according to the present preferred embodiment may be manufactured through the above-described procedure.

<<Solar Cell Module>>

While the solar cell 10A according to the present preferred embodiment can be used by itself, a plurality of solar cells 10A, each having the same configuration, may be arranged adjacent to one another and connected in series, thereby forming a module. In such a case, each adjacent pair of solar cells 10A are connected to each other by joining a wiring material both to the back electrode portion 4c provided on the second surface 1S of one of the solar cells 10A and to the bus bar portion 5a provided likewise on the second surface 1S of the other solar cell 10A. Unlike in a conventional solar cell module, a wiring material does not need to be bent for connection, which thereby reduces the occurrence of the wiring material peeling off the electrodes.

In one preferable example, a wiring material may be obtained by covering the surface of a copper foil, which has a thickness of 0.1 to 0.2 mm and having a width of approximately 2 mm, with a solder material and then cutting the covered copper foil to a predetermined length. Furthermore, in consideration of environmental issues, the solder material may preferably be a lead-free solder. Alternatively, the electrodes and the wiring material may be connected with a conductive adhesive.

Note that, as necessary, a solder region may be formed by dip soldering in each of the first connection portion 4c and the bus bar portion 5a before joining a wiring material.

Second Preferred Embodiment

Figure 6:
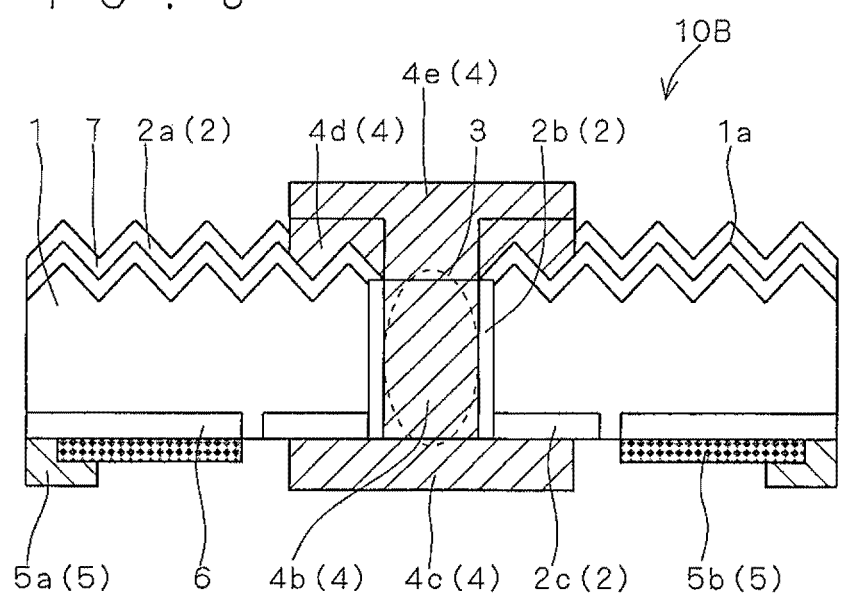
FIG. 6 is a schematic cross-sectional diagram showing a configuration of a solar cell 10B according to a second preferred embodiment.

FIG. 6 is a schematic cross-sectional diagram showing a configuration of a solar cell 10B according to a second preferred embodiment of the present invention. The solar cell 10B according to the present preferred embodiment differs from the solar cell 10A according to the first preferred embodiment in the structure of the first electrode 4. Thus, those components that have the same functions and effects as the components of the solar cell 10A are denoted by the same reference numerals and characters, and their description will be omitted herein.

In the solar cell 10B according to the present preferred embodiment, the main electrode portion 4a consists of two layers, namely a contact portion (second portion) 4d and a non-contact portion (first portion) 4e. The contact portion 4d is a part that is connected directly to the first opposite conductivity type layer 2a. On the other hand, the non-contact portion 4e is a part that is formed on the contact portion 4d as well as connected to the conducting portion 4b, but this is a part that is intentionally not connected to the opposite conductivity type layer 2. The presence of such a non-contact portion 4e enables the contact portion 4d and the conducting portion 4b to be spaced apart from each other.

The contact portion 4d and the non-contact portion 4e have a relationship similar to that between the glass content ratios of the main electrode portion 4a and the conducting portion 4b in the solar cell 10A according to the first preferred embodiment. In other words, the first electrode 4 of the solar cell 10B according to the present preferred embodiment is so formed that the conducting portion 4b and the non-contact portion 4e that need not be in contact with the first opposite conductivity type layer 2a have smaller glass abundance ratios as compared to the glass content of the contact portion 4d that needs to be in contact with the first opposite conductivity type layer 2a.

Such a contact portion 4d and a non-contact portion 4e can be obtained by forming the former with a first conductive paste and the latter with a second conductive paste. In an alternative embodiment, the non-contact portion 4e may be formed with a third conductive paste that has a different composition from the second conductive paste, but that is identical to the second conductive paste in that it has a smaller glass fit abundance ratio than the first conductive paste.

By, in this way, providing the main electrode portion 4a with a two-layer structure consisting of the contact portion 4d and the non-contact portion 4c as well as reducing the glass content of the non-contact portion 4e, the electrical resistance of the main electrode portion 4a can be further reduced and current can be passed efficiently through the conducting portion 4b. In particular, if the non-contact portion contains no glass, the electrical resistance can be further reduced and, thereby, resistance loss in current can be further reduced.

Figure 7:
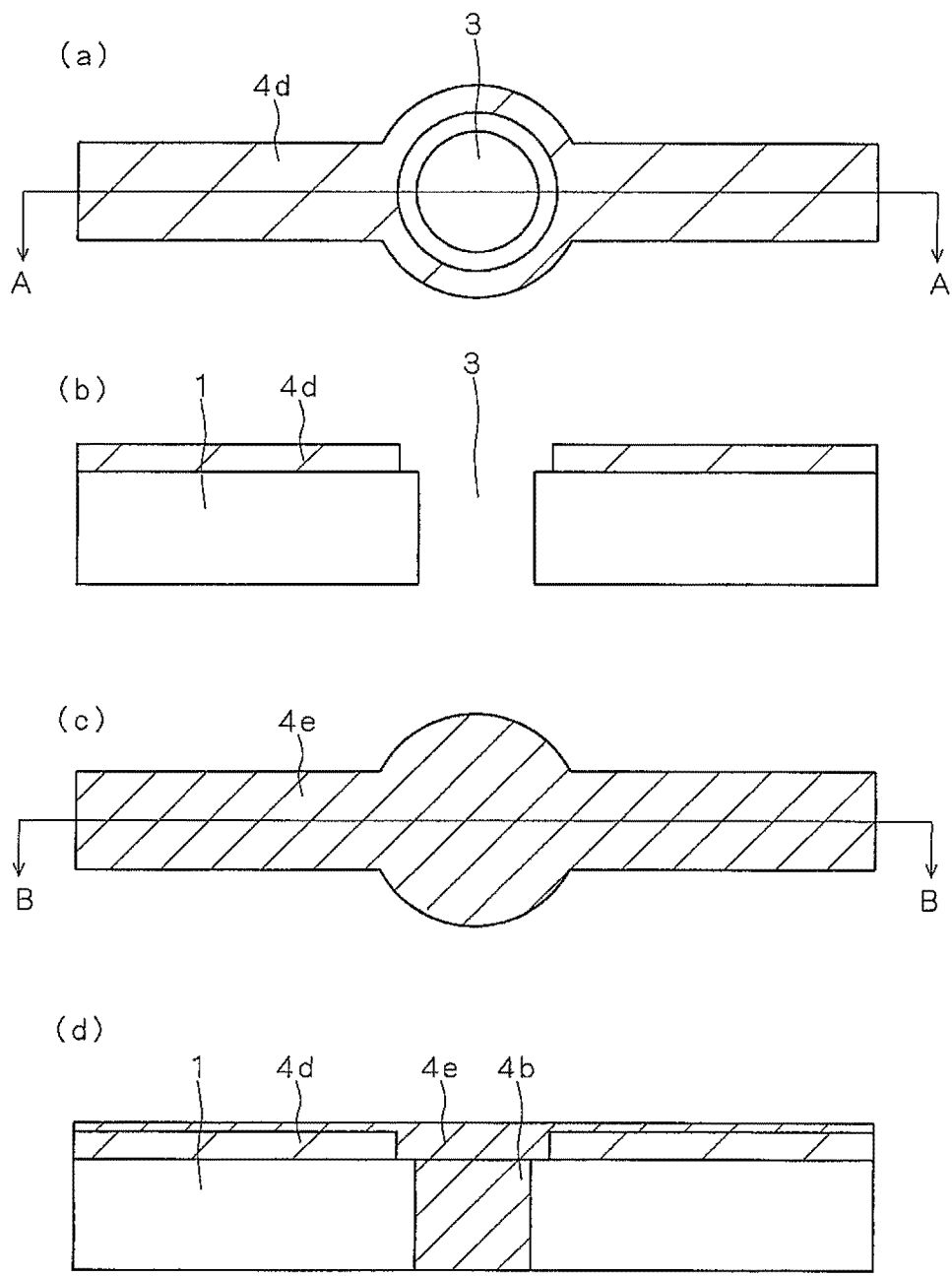
FIG. 7 is a diagram for explaining an exemplary embodiment of the formation of the conducting portion 4b, a contact portion 4d, and a non-contact portion 4e.

FIG. 7 is a diagram for explaining an exemplary embodiment of the formation of the conducting portion 4b, the contact portion 4d, and the non-contact portion 4e according to the present preferred embodiment. First, a coating film equivalent to the contact portion 4d is formed by applying a first conductive paste so as to form a pattern as shown, for example, in FIG. 2(a) or 2(b). Note that, at this time, the coating film is formed so as to surround the peripheries of the through holes 3 as shown in FIGS. 7(a) and 7(b). FIG. 7(b) is a diagram showing a cross-section taken along line A-A in FIG. 7(a).

Thereafter, the through holes 3 are filled in and another coating film equivalent to the non-contact portion 4e is formed by applying a second conductive paste in a similar pattern as shown in FIGS. 7(c) and 7(d). Here, FIG. 7(d) is a diagram showing a cross-section taken along line B-B in FIG. 7(c). Such simultaneous formation of the non-contact portion 4e and the conducting portion 4b using the same second conductive paste improves productivity.

After the formation of the coating films, drying and firing are performed as in the first preferred embodiment, thereby forming the contact portion 4d, the conducting portion 4b, and the non-contact portion 4e.

Further, if the viscosity of the second conductive paste is smaller than the viscosity of the first conductive paste, there is the advantage that the non-contact portion 4e and the conducting portion 4b are easy to form simultaneously, because of high fluidity at the time of applying the second conductive paste.

Also, in the case where both the application of the first conductive paste and the application of the second conductive paste are performed by screen printing, the opening width of a screen for use in the formation of the non-contact portion 4e may preferably be formed larger than the opening width of a screen for use in the formation of the contact portion 4d. By doing so, a line pattern with a small line width and a large thickness can be formed. For example, in one preferable example, the opening width of the screen for use in the formation of the contact portion 4d may be between 30 and 60 μm and the opening width of the screen for use in the formation of the non-contact portion 4e may be between 50 and 80 μm.

Moreover, if the through holes 3 are formed in a tapered shape that narrows from the first surface 1F side toward the second surface 1S, the non-contact portion 4e and the conducting portion 4b are easy to form simultaneously. For example, if the through holes 3 are formed by laser-light irradiation from the first surface 1F side (the light receiving surface side) of the semiconductor substrate 1, the through holes 3 will narrow from the first surface 1F side toward the second surface 1S side.

Still more, if the openings of the through holes 3 are circular in shape, the opening diameter may preferably be between 50 and 300 μm. More specifically, the through holes 3 may preferably be formed so that the ratio (S2/S1) of a cross-sectional area S2 of the back surface opening to a cross-sectional area S1 of the light receiving surface opening is in the range expressed by $0.5 \geq (S2/S1) \geq 0.9$ and, more preferably, $0.65 \geq (S2/S1) \geq 0.8$.

If the ratio (S2/S1) is smaller than 0.5, the resistance value of the first electrode 4 on the back surface side increases; and if the ratio is larger than 0.9, moisture intrusion cannot be sufficiently prevented.

Still more, if the through holes 3 have any damaged layers, etching may preferably be performed; for example, mirror etching may be performed in a solution obtained by mixing a 2:7 ratio of a hydrofluoric acid and a nitric acid.

Third Preferred Embodiment

Figure 8:
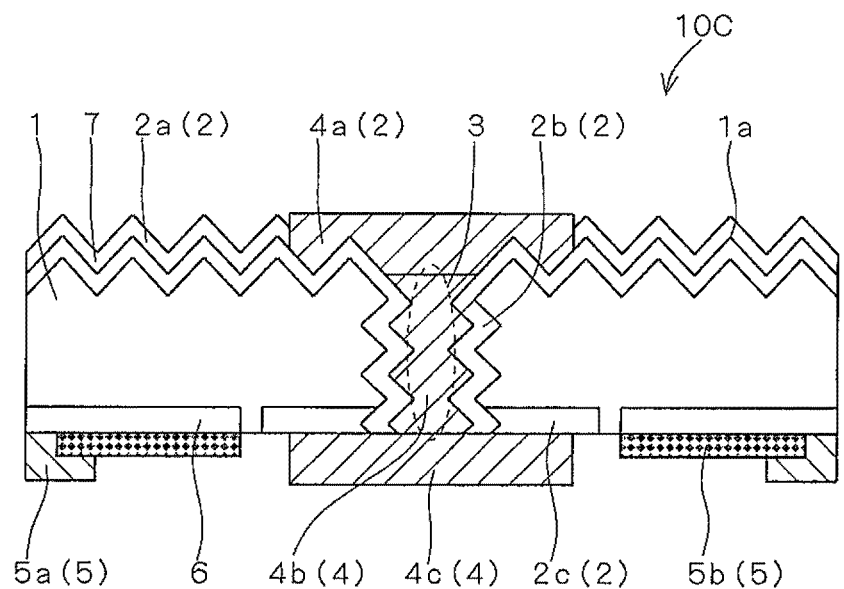
FIG. 8 is a schematic cross-sectional diagram showing a configuration of a solar cell 10C according to a third preferred embodiment.

FIG. 8 is a schematic cross-sectional diagram showing a configuration of a solar cell 10C according to a third preferred embodiment of the present invention. The solar cell 10C according to the present preferred embodiment includes components similar to those of the solar cell 10A according to the first preferred embodiment, but differs from the solar cell 10A in that the through holes 3 have roughened surfaces (have an uneven structure).

With through holes 3 so configured, even in the case where the conducting portion 4b is formed with a conductive paste having a low glass content as described above, the adhesion of the conducting portion 4b to the second opposite conductivity type layer 2b can be improved by an anchoring effect. Both the heights and widths of the projections on the surfaces of the through holes 3 may preferably be 30 μm or less.

Such surface roughening is performed by, after forming the through holes 3 as shown in FIG. 4(b), etching the semiconductor substrate 1 in an acid or alkaline solution.

In the case where the semiconductor substrate 1 is a silicon substrate, an acid solution may preferably be a mixed aqueous solution of an hydrofluoric acid and a nitric acid. In this case, a hydrofluoric acid solution may preferably have a concentration of 30 to 60 wt %; and a nitric acid solution may preferably have a concentration of 2 to 20 wt %. Alternatively, an acetic acid having a concentration of 1 to 15 wt % may be added to the above mixed solution.

On the other hand, an alkaline solution may preferably be an aqueous solution such as sodium hydroxide, potassium hydroxide, calcium hydroxide, or the like. Such an aqueous solution may preferably have a concentration of 1 to 50 wt %. If such a solution is used at a temperature between 50 and 100° C., the etch rate can be increased. Furthermore, the shape of the roughened surfaces may be controlled by adding an organic solvent, such as isopropyl alcohol (IPA), that has a concentration of 0.1 to 20 wt %.

Note that, in the case of the present preferred embodiment, the removal of a mechanically damaged or contaminated layer of a substrate surface portion generated by slicing of the substrate may be performed simultaneously with the step of roughening the surfaces of the through holes 3.

The present preferred embodiment enables a solar cell to improve the efficiency of collecting photogenerated carriers in the conducting portion 4b while reducing damage given to the semiconductor substrate 1.

(Variations)

<Formation of Insulating Material Layer>

Figure 9:
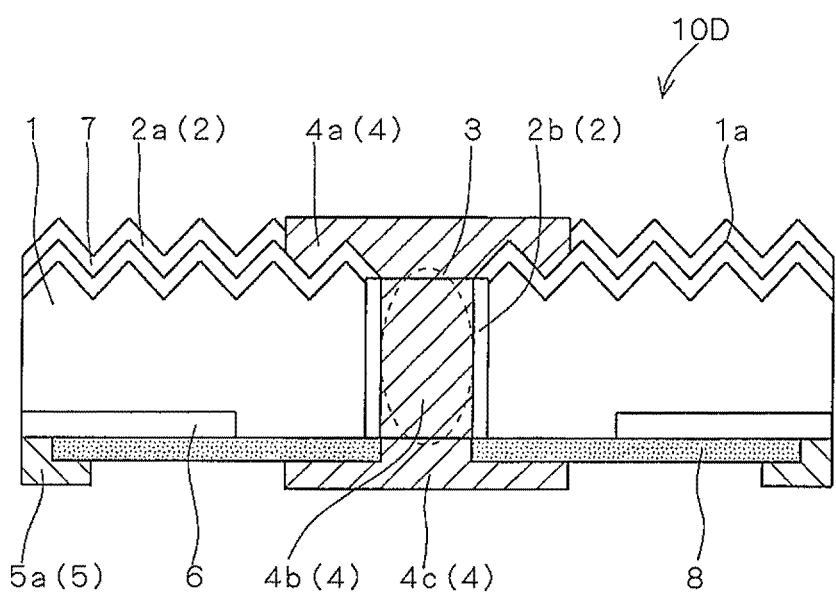

FIG. 9 is a schematic cross-sectional diagram of a solar cell 10D in which an insulating material layer 8 of oxide film, nitride film, or the like is formed instead of the third opposite conductivity type layer 2c.

The formation of the insulating material layer 8 prevents direct contact between the semiconductor substrate 1 and the back electrode portion 4c, thus reducing the occurrence of leakage between the semiconductor substrate 1 and the back electrode portion 4c. Besides, if the insulating material layer 8 is formed of an oxide film or nitride film, the rate of surface recombination on the second surface 1S of the semiconductor substrate 1 is reduced by the effect of passivation, which improves the output characteristics of the solar cell.

Specifically, the insulating material layer 8 may be formed by forming a silicon oxide film ($SiO_2$ film), a titanium oxide film ($TiO_2$), a silicon nitride film (SiNx), or the like to a thickness of approximately 10 nm to 50 μm by a method such as a sputtering method, a vapor depotision method, or a CVD method. Alternatively, an oxide film that will be the insulating material layer 8 may be formed by subjecting the semiconductor substrate 1 to heat treatment performed in a thermal oxidation furnace in an atmosphere of oxygen or air or by applying and firing an oxide film material using a method of application such as a spin coating method, a spraying method, or a screen printing method. Note that the insulating material layer 8 may be either a single layer film or a plurality of layers having a two-layer structure consisting of a silicon oxide film and a silicon nitride film, or the like.

Note that if the insulating material layer 8 contains hydrogen, the passivation effect is further improved. For example, a silicon nitride film formed by a plasma CVD method contains hydrogen (H) and thus can reduce the possibility that carriers may be captured by dangling bonds, by diffusing hydrogen (H) into the semiconductor substrate 1 by heating during and after film deposition and then bonding hydrogen (H) to dangling bonds (excess chemical bonds) that exist in the semiconductor substrate 1. Thus, a highly efficient solar cell can be obtained by, for example, forming a silicon nitride film on an approximately whole second surface 1S.

Also, with the insulating material layer 8 formed on an approximately whole second surface 1S, the opposite conductivity type layer 2 is less likely to be formed on the back surface side of the semiconductor substrate 1 at the time of forming an opposite conductivity type layer (diffusion layer). In particular, use of a CVD method, an application method, or the like is preferable because only the insulating material layer 8 can be formed on just the second surface of the semiconductor substrate 1.

Still more, in the case where the back electrode portion 4c is formed on the insulating material layer 8, since the electrode contains a glass frit, the electrode strength can be improved as compared with the case where the electrode is formed on the semiconductor substrate 1. Note that if the firing temperature at the time of forming an electrode is set at a low temperature (of approximately 500 to 700° C.), problems can be reduced, such as the occurrence of leakage due to the small thickness of the insulating material layer 8 causing a conductive paste (electrode) to penetrate the insulating material layer 8 in the fire-through method and the first electrode 4 thereby making contact with the semiconductor substrate 1.

As another alternative, hydrogen may be added to the semiconductor substrate 1 after the insulating material layer 8 has been formed. This causes hydrogen to be diffused into the grain boundary of the semiconductor substrate 1, thereby bringing about a passivation effect. One example of the method of adding hydrogen is that the semiconductor substrate 1 is subjected to plasma processing in an atmosphere of hydrogen. Or, an inert gas such as helium or argon may be mixed into such an atmosphere of hydrogen. The frequency of a power supply for generating such a hydrogen plasma may be of a radio frequency (RF) or a microwave.

Figure 10:
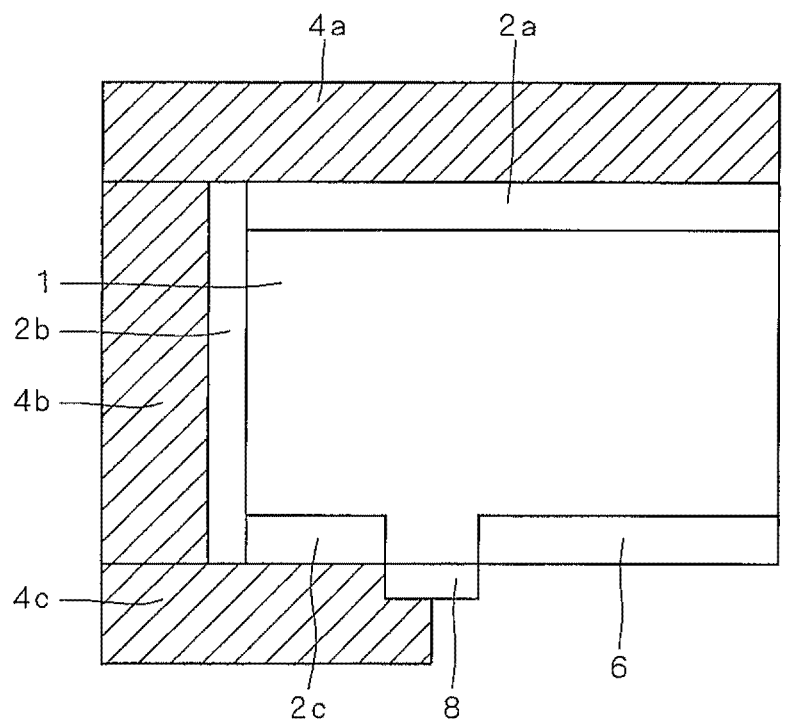
FIG. 10 is a diagram illustrating still another embodiment of the formation of the insulating material layer 8.

FIG. 10 is a diagram illustrating another embodiment of the formation of the insulating material layer 8. More specifically, in another embodiment, p-n isolation may be achieved by forming the heavily doped layer 6 in the vicinity of the third opposite conductivity type layer 2c and then applying and firing a glass paste containing a component of the insulating material layer 8 on a boundary portion between the heavily doped layer 6 and the third opposite conductivity type layer 2c as shown in FIG. 10. Alternatively, after firing, the insulating material layer 8 containing glass may be left and the first electrode 4 may be formed thereon.

<Other Variations>

FIG. 11 is a diagram illustrating another embodiment of the back electrode portions 4c. The shape of the back electrode portion 4c is not limited to a strip shape as shown in FIG. 3 and, instead, the back electrode portion 4c may be formed for example into points on the conducting portion 4b as shown in FIG. 11(a). In this case, as illustrated in FIG. 11(b), which shows a cross-section taken along Y-Y in FIG. 11(a), the insulating material layer 8 may preferably be formed between each adjacent pair of such point-like back electrode portions 4c. This brings about a passivation effect and thereby improves the output characteristics of the solar cell. In another embodiment, the heavily doped layer 6 may be formed between each adjacent pair of such point-like first connection portions 4c.

Also, the application and firing at the time of forming the main electrode portion 4a, the conducting portion 4b, the back electrode portion 4c, the bus bar portion 5a, and the current collecting portion 5b are not necessarily performed in the order described in the above-described preferred embodiments. For example, in another embodiment, all electrodes may be formed by performing firing in one operation after all conductive pastes for forming these portions have been applied. As another alternative, after the current collecting portion 5b, the bus bar portion 5a, the back electrode portion 4c, and the conducting portion 4b have been formed by the application and firing of conductive pastes, the main electrode portion 4a may be formed by the application and firing of a conductive paste. In another embodiment, the above procedures may be combined appropriately.

In still another embodiment, the insulating material layer 8 may be formed also on the surfaces of the through holes 3, without forming the second opposite conductivity type layer 2b. Note that, even in this case, the conducting portions 4b may preferably be formed with a second conductive paste containing no glass frit. By doing so, there is no possibility that, at the time of firing the second conductive paste at a predetermined temperature or higher, a glass frit in the second conductive paste may penetrate (or be fired through) the insulating material layer 8, thereby generating a leakage current between the conducting portion 4b and the semiconductor substrate 1. One preferable example of adopting such a second conductive paste is, for example, the case where the second conductive paste is fired simultaneously with a first conductive paste that contains a glass frit applied on the anti-reflective coating 7.

An embodiment of the formation of the opposite conductivity type layer 2 is not limited to those described above. For example, a crystalline silicon film including an amorphous silicon hydride film, a microcrystalline silicon film, and the like may be formed using a thin-film deposition technique. Here, if the opposite conductivity type layer 2 is formed of an amorphous silicon hydride film, its thickness may preferably be 50 nm or less and, more preferably, 20 nm or less; and if the opposite conductivity type layer 2 is formed of a crystalline silicon film, its thickness may preferably be 500 nm or less and, more preferably, 200 nm or less. Furthermore, an i-type (undoped type) silicon region may be formed to a thickness of 20 nm or less between the semiconductor substrate 1 and the opposite conductivity type layer 2.

The heavily doped layer 6 may be formed of a crystalline silicon film or the like including, for example, an amorphous silicon hydride film or a microcrystalline silicon phase, using a thin-film deposition technique. In particular, if the p-n junction between the opposite conductivity type layer 2 and a bulk region (a region other than the opposite conductivity type layer 2) of the semiconductor substrate 1 is formed using a thin-film deposition technique, the heavily doped layer 6 may also preferably be formed using a thin-film deposition technique. At this time, the heavily doped layer 6 may have a film thickness of approximately 10 to 200 nm. Furthermore, if an i-type silicon region is formed to a thickness of 20 nm or less between the semiconductor substrate 1 and the heavily doped layer 6, it is effective in improving the characteristics.

Moreover, in another alternative, at the time of forming the anti-reflective coating 7 on the first surface 1F of the semiconductor substrate 1, the anti-reflective coating 7 may be formed on the surfaces of the through holes 3. In this case, for example if the second conductive paste has a glass-frit content of one fifth or less, more preferably one tenth or less, of the glass-frit content of the first conductive paste, the glass fit in the second conductive paste can be prevented from penetrating the anti-reflective coating 7 formed on the surfaces of the through holes 3. This also reduces the damage that glass frit penetrating the anti-reflective coating 7 inflicts on a p-n junction, even if the anti-reflective coating 7 formed on the first surface 1S has a smaller thickness than the anti-reflective coating 7 formed on the surfaces of the through holes 3.

EXAMPLES

In the present example, seven solar cells whose conducting portions 4b have different values of glass-component content were produced as solar cells according to the first preferred embodiment and a solar cell according to a comparative example, and their characteristics were evaluated.

First, a polycrystalline silicon substrate having a thickness of 230 μm and outer dimensions of 15 cm×15.5 cm was prepared as the semiconductor substrate 1 of each solar cell. Such polycrystalline silicon substrates had previously been doped with a dopant so as to have a p conductivity type.

A plurality of through holes 3 were formed at a pitch of 2 mm in each of the prepared polycrystalline silicon substrates, using a YAG laser. Further, a textured structure 1a was formed by the RIE method on the major surface side that is a light receiving surface (the first surface 1F). Then, an n type opposite conductivity type layer 2 (the first opposite conductivity type layer 2a, the second opposite conductivity type layer 2b, and the third opposite conductivity type layer 2c) having a sheet resistance of 90Ω/□ was formed by phosphorus atom diffusion. On the light receiving surface side, an anti-reflective coating 7 of silicon nitride was also formed by a plasma CVD method. Note that part of the opposite conductivity type layer formed on another major surface side or back surface (second surface 1S) was removed in a hydrofluoric acid solution so as to provide p-n isolation.

Then, a heavily doped layer 6 and a current collecting portion 5b were formed by applying and firing an aluminum paste on the back surface side. Subsequently, a silver paste was applied and fired on both the surfaces so as to form a main electrode portion 4a, a conducting portion 4b, a back electrode portion 4c, and a bus bar portion 5a.

At this time, the silver paste (first conductive paste) used in either solar cell for forming the main electrode portion 4a, the back electrode portion 4c, and the bus bar portion 5a contained 4 parts by weight of a glass frit per 100 parts by weight of silver.

On the other hand, the silver pastes (second conductive pastes) used in Examples 1 to 6 for forming the conducting portion 4b respectively contained 0 parts by weight of a glass fit, 0.05 parts by weight of a glass frit, 0.1 parts by weight of a glass frit, 0.5 parts by weight of a glass frit, 0.8 parts by weight of a glass fit, and 1 part by weight of a glass frit per 100 parts by weight of silver. In the comparative example, the first conductive paste was also used for forming the conducting portion 4b.

For each of the respective examples and the comparative example, ten solar cells were produced under the same conditions and the output characteristics of those solar cells were evaluated. Table 1 shows the output characteristics in the respective examples and the comparative example. Note that the value in each item is an average value for the ten solar cells.

TABLE 1

|  | Glass (Wt. Parts) | Isc (A) | Voc (V) | F.F. (—) | Pmax (W) | Efficacy (%) |
|---|---|---|---|---|---|---|
| Example 1 | 0 | 8.357 | 0.613 | 0.767 | 3.929 | 16.90 |
| Example 2 | 0.05 | 8.368 | 0.612 | 0.766 | 3.923 | 16.87 |
| Example 3 | 0.1 | 8.361 | 0.613 | 0.765 | 3.921 | 16.86 |
| Example 4 | 0.5 | 8.377 | 0.612 | 0.763 | 3.912 | 16.82 |
| Example 5 | 0.8 | 8.384 | 0.613 | 0.761 | 3.911 | 16.82 |
| Example 6 | 1 | 8.382 | 0.612 | 0.758 | 3.888 | 16.72 |
| Comparative Ex. | 4 | 8.385 | 0.613 | 0.756 | 3.886 | 16.71 |

As shown in Table 1, from among the solar cells according to Examples 1 to 6, the solar cell of Example 6 whose conducting portion 4b has the highest glass-component content had an F.F. value and element efficiency both comparable to the solar cell of the comparative example. The solar cells of Examples 1 to 5, which had lower values of glass-component content than Example 6, had F.F. values of 0.761 or higher and element efficiencies of 16.82% or higher, i.e., element efficiency could be increased by approximately 0.1% or more from that of the comparative example. In particular, in Example 1 where the conducting portion 4b contained no glass component, the F.F. value was 0.767 and the element efficiency was 16.90%, i.e., the element efficiency could be increased by approximately 0.2% from that of the comparative example.

That is, it was confirmed that a solar cell according to the present invention, in which the conducting portion 4b had a low glass-component content, had more excellent element characteristics than a conventional solar cell.

The invention claimed is:

1. A solar cell comprising:
   a silicon substrate of one conductivity type comprising a first surface receiving sunlight,
   a second surface on a back side of the first surface,
   a through hole passing through between the first surface and the second surface; and
   a first electrode comprising a main electrode portion containing a glass component and formed on the first surface of the silicon substrate, and a conducting portion electrically connected to the main electrode portion, formed in the through hole of the silicon substrate,
   wherein the conducting portion comprises at least one metal component selected from the group consisting of silver and copper, and further has a glass-component content that is not zero and is one fifth or less of the glass-component content of the main electrode portion,
   wherein the silicon substrate comprises a first opposite conductivity type layer formed on the first surface, and a second opposite conductivity type layer formed on the surfaces of the through holes,
   wherein the first opposite conductivity type layer and the second opposite conductivity type layer have the same conductivity type,
   wherein the main electrode portion is formed on the first opposite conductivity type layer of the silicon substrate, and
   wherein the conducting portion is formed on the second opposite conductivity type layer in the through hole.

2. The solar cell according to claim 1, wherein a surface of the through hole is rough.

3. The solar cell according to claim 2, wherein the surface of the through hole comprising a projection with a height of 30 μm or less and a width of 30 μm or less.

4. The solar cell according to claim 1, wherein the first electrode further comprises a back electrode portion which is formed on the second surface of the silicon substrate and is connected to the conducting portion.

5. The solar cell according to claim 1, wherein the first electrode has a first polarity, the solar cell further comprising a second electrode which has a second polarity different from the first polarity and is formed on the second surface of the silicon substrate.

6. The solar cell according to either claim 1, wherein said main electrode portion and said conducting portion contain the same metal component.

* * * * *